United States Patent [19]

Cordani

[11] Patent Number: 4,775,444

[45] Date of Patent: Oct. 4, 1988

[54] PROCESS FOR FABRICATING MULTILAYER CIRCUIT BOARDS

[75] Inventor: John L. Cordani, Waterbury, Conn.

[73] Assignee: MacDermid, Incorporated, Waterbury, Conn.

[21] Appl. No.: 89,741

[22] Filed: Aug. 26, 1987

[51] Int. Cl.[4] .......................... C23F 1/02; B44C 1/22; C03C 15/00; C03C 25/06

[52] U.S. Cl. .................... 156/634; 156/656; 156/659.1; 156/661.1; 156/666; 156/902; 148/6.2; 427/97

[58] Field of Search ............... 156/629, 630, 634, 645, 156/656, 659.1, 661.1, 666, 902, 150, 151; 174/68.5; 427/96, 97, 98, 399; 428/596, 601, 137, 901, 413–416; 148/6.14 R, 6.2

[56] References Cited

U.S. PATENT DOCUMENTS

| | | | |
|---|---|---|---|
| 2,955,974 | 10/1961 | Allen et al. | 154/128 |
| 3,177,103 | 4/1965 | Tally et al. | 156/3 |
| 3,198,672 | 8/1965 | De Hart | 143/6.14 |
| 3,240,662 | 3/1966 | Smyers et al. | 161/225 |
| 3,374,129 | 3/1968 | Boucher | 156/3 |
| 3,481,777 | 12/1969 | Spannhake | 117/212 |
| 3,833,433 | 9/1974 | Caule | 156/630 |
| 4,075,757 | 2/1978 | Malm et al. | 156/902 X |
| 4,358,479 | 11/1982 | Canestaro et al. | 427/98 |
| 4,409,037 | 11/1983 | Landau | 148/6.14 R |
| 4,512,818 | 4/1985 | Valayil et al. | 148/6.14 R |
| 4,702,793 | 10/1987 | Garlough et al. | 156/629 |
| 4,717,439 | 1/1988 | Hajdu et al. | 156/280 |

*Primary Examiner*—William A. Powell
*Attorney, Agent, or Firm*—St. Onge Steward Johnston & Reens

[57] ABSTRACT

Printed circuit boards having copper circuit patterns coated with an adhesion promoter (e.g., copper oxide, tin) are subjected to the action of an aqueous chromic acid solution prior to incorporation in a multi-layer board by interposing layers of semi-cured polymeric non-conductive material between the individual boards and laminating the assembly using heat and pressure. The chromic acid treatment serves to improve adhesion between the layers and, in particular, to overcome or minimize the "pink ring" effect which is frequently observed around holes drilled through multilayer boards.

14 Claims, No Drawings

PROCESS FOR FABRICATING MULTILAYER CIRCUIT BOARDS

BACKGROUND OF THE INVENTION

1. Field of the Invention

This invention relates to an improved process for the preparation of multilayer printed circuit boards and is more particularly concerned with improving the adhesion between copper circuit patterns and polymeric substrates.

2. Description of the Prior Art

Multilayer printed circuit boards are assemblies of several two-sided printed circuit boards bonded to each other through layers of semi-cured polymeric material by lamination using heat and pressure. The multilayer boards provide high packaging density, short conductor lengths and good reliability. At the same time weight and space are conserved. Accordingly, such boards are finding increased use.

The two-sided printed circuit boards from which the multilayer printed circuit boards are built are generally fabricated from a polymeric substrate such as phenolic resins, epoxy resins, polyimides, polyesters and the like, clad on both sides with a thin layer of copper. Printed circuits are formed on the copper layers by conventional techniques. Illustratively, a layer of photoresist is coated over the copper layer, exposed imagewise and developed to yield a relief resist image on the copper layer. The exposed copper is etched away and the resist image is removed leaving the copper circuit pattern exposed. The latter is then chemically treated to form thereon a surface layer of copper oxide, tin or other adhesion promotor as described in, for example, U.S. Pat. Nos. 2,955,974; 3,177,103; 3,198,672; 3,240,662; 3,374,129; 3,481,777; 4,409,037 and 4,512,818.

Any desired number of the two-sided boards so prepared is then assembled into the multilayer circuit board by forming a stack of the boards with layers of semi-cured polymeric non-conductive material such as epoxy resin interposed between the individual boards. The assembly is laminated by application of heat and pressure. Typical of such laminating conditions are pressing at about 300 psi to about 400 psi at a temperature at about 150° C. to about 205° C. for a time of up to about 4 hours. The circuits on the inner and outer layers are then connected by drilling an array of holes in the board, cleaning the holes to remove resin smear by treatment with acids and the like and thereafter plating with copper to render the sides of the holes conductive.

The use of a copper oxide layer as an adhesion promoter between the printed copper circuit patterns and the intermediate polymeric dielectric layers of the multilayer board has been employed for a number of years. However, problems have arisen which have prompted a search for improved coatings. Thus total or local delamination of copper circuit pattern layers and polymeric layers can occur due to poor adhesion and/or the susceptibility of the copper oxide layer to dissolve when exposed to acidic and/or reducing solutions in later treatment of the multilayer board.

A major problem due to a combination of poor adhesion and the susceptibility of the copper oxide to dissolution is that known as the "pink ring" or "halo" effect. When the multilayer boards are drilled in preparation for making interlayer connections by plated through holes, a combination of stress and heat at the drill interface can cause local delamination between the copper circuit pattern inner layers and the intermediate polymeric resin layers. The copper oxide coating which is then exposed may be dissolved by the acid or like solutions employed to clean the resin smear from the drilled hole prior to plating the hole. Removal of the copper oxide coating around the edges of the copper circuit pattern adjacent to the through-hole reveals the underlying copper as a pink ring or halo. This causes cosmetic as well as functional problems.

A number of approaches to solving this widespread problem have been tried. Thus, pressing conditions employed in the lamination have been varied to optimize the adhesion promoted by the copper oxide coating. This has met with limited success. Thicker coatings of copper oxide have been used in order to retard the dissolution process by shear volume of the copper oxide present. However, the thicker coatings give poor adhesion and therefore do not solve the problem. Another approach has been to use a coating of tin in place of the copper oxide layer as an adhesion promoter but the level of adhesion achieved has not been sufficient to overcome the problem.

It has now been found that the problems which have been encountered hitherto due to delamination, either total or local, of the copper circuit patterns and the intermediate polymeric resin layers in multilayer printed circuit boards can be overcome by a post treatment of the adhesion promotor layer of copper oxide, tin or like promoters, prior to lamination of the individual two-sided boards into the multilayer board.

SUMMARY OF THE INVENTION

It is an object of the invention to provide an improved process for the fabrication of multilayer printed circuit boards.

It is a further object of the invention to provide multilayer printed circuit boards having improved adhesion between, and greater resistance to delamination of, the layers therein.

It is yet another object of the invention to provide multilayer printed circuit boards which are substantially free from a pink ring or halo effect associated with the through-holes therein.

These objects, and other objects which will become apparent from the description which follows, are achieved by the process and articles of the present invention. The process of the invention in its broadest aspect comprises an improvement in a process for the preparation of a multilayer circuit board comprising the steps of providing a non-conductive substrate clad on each side with a copper circuit pattern layer, coating each of the latter layers with an adhesion promoter, incorporating the resulting board and one or more additional boards prepared in the same manner into a multilayer board by interposing layers of semi-cured polymeric non-conductive material between the boards and laminating the assembly using heat and pressure, wherein the improvement comprises exposing the copper circuit patterns coated with adhesion promoter to the action of an aqueous chromic acid solution prior to incorporation of the individual boards into the multilayer board.

The invention also comprises with multilayer printed circuit boards prepared in accordance with the process of the invention.

DETAILED DESCRIPTION OF THE INVENTION

In preparing the improved multilayer printed circuit boards in accordance with the invention any of the procedures conventional in the art for the preparation of such boards can be employed with the exception that, after the copper circuit patterns on the individual boards have been coated with an adhesion promoter, a novel step is introduced prior to incorporating the individual boards into the multilayer board. The novel step comprises exposing the copper circuit patterns coated with adhesion promoter to the action of an aqueous chromic acid solution for a limited period of time.

The step in question is accomplished advantageously by immersing the board with coated copper circuit patterns in the aqueous chromic acid solution but it may also be accomplished by spraying the circuit patterns with the chromic acid solution or by like means. The aqueous chromic acid solution can be formed by dissolving the requisite amount of chromium trioxide (also known as chromic anhydride) in water or it can be formed in situ by acidifying an aqueous solution of an alkali metal chromate or bichromate to a pH of the order of about 1.5 to about 2.5 using a strong mineral acid such as concentrated sulfuric acid. Advantageously the chromic acid solution, in whichever manner prepared, contains from about 0.1 to about 50 grams per liter and, preferably, from about 1.0 to about 2.0 grams per liter of chromic acid. The chromic acid solution is advantageously at a temperature in the range of about 20° C. to about 90° C., and preferably in the range of 65° C. to 75° C., during the treatment of the coated copper circuitry.

The period of time for which the copper circuit patterns coated with adhesion promoter are exposed to the action of the chromic acid solution can vary from as little as 10 seconds to as much as 5 minutes but is preferably in the range of about 1 to about 2 minutes. The appropriate time of exposure in any given instance is dependent upon the particular adhesion promotor employed, the temperature of the chromic acid solution, and the method by which the chromic acid solution is applied to the coated copper circuit patterns. The most appropriate time of exposure in any given instance can be determined readily by a process of trial and error.

When the treatment with chromic acid solution has been completed the treated board is rinsed with water and dried. The board so obtained is then employed together with a plurality of similarly treated boards in the assembly of a multilayer board. This is carried out by arranging the boards in a properly sequenced and layer oriented stack. Sheets of partially cured polymeric resins (prepregs) such as epoxy resin and the like are interleaved between the boards. The boards and interleaved prepregs are usually pinned onto a caul plate which is used to hold the finished stack during the lamination process. When the stack has been completed in this manner a second caul plate is pinned on top. The stack and caul plates are then placed between the platens of an appropriate press and subjected to pressing using pressures and temperatures in the ranges set forth herein above for a time generally within the range of about 1 to about 4 hours. The resulting laminated multilayer board is generally subjected to a post-bake at a temperature of the order of about 150° C. before being treated further.

In order to provide any required electrical connections between circuits in the various layers of the multilayer board, holes are drilled through the board in predetermined locations and the sides of the holes are subsequently plated with copper, generally by electroless copper plating, in order to provide the necessary electrical contact between layers. However, as set forth above, before the plating is carried out the holes have to be treated to remove resin smear left in the holes in the drilling process. This is accomplished using acidic solutions, for example, using dilute sulphuric acid. It is in this particular operation that the effect of the markedly improved adhesion between copper circuit patterns and resin substrate achieved by the process of the invention is manifested. Thus the adhesion between the copper circuit patterns and the resinous interleaved substrates is such that, unlike the multilayer boards hitherto known, no significant delamination has taken place during the drilling procedure. Accordingly the copper oxide or other adhesion promoter which is coated on the copper circuit pattern is not exposed to the action of the acid solution employed in the desmearing of the holes. Hence, the adhesion promoter in the layers surrounding the holes is not dissolved by the acid and no underlying copper is thereby exposed so that no pink ring effect is observed after the treatment with the desmearing acid solution.

As set forth above the adhesion promoters, with which the copper circuit patterns on the various boards are coated prior to the chromic acid treatment of the invention, can be any of those previously employed in the art. Illustrative of such adhesion promoters are copper oxide, tin and the like. A particularly advantageous method of applying a layer of adhesion promoting copper oxide involves treating the copper circuit patterns with an oxidizing solution containing an alkali or alkaline earth metal chlorite in a concentration of from 50 grams per liter to complete saturation and an alkali metal hydroxide in a concentration of from 5 to 25 grams per liter. Appropriate conditions for carrying out this treatment are described, for example, in Landau U.S. Pat. No. 4,409,037.

The multilayer printed circuit boards which are prepared in accordance with the invention are characterized by markedly improved adhesion between the layers as evidenced particularly by the substantial absence of any pink ring effect associated with the through-holes in the finished boards.

The following examples illustrate specific embodiments of the process and products of the invention and the best mode currently known to the inventors for carrying out the same but are not to be construed as limiting.

EXAMPLE 1

Pretreatment

In this and all following examples the surface of the copper specimens employed was subjected to a standard pretreatment process as follows.

The specimen was first cleaned by immersion in an alkaline cleaning solution containing a mixture of trisodium phosphate, sodium carbonate and an alkaline stable surfactant (1707 Soak Cleaner; MacDermid, Incorporated, Waterbury, Conn.: 8 oz. per gallon) for 5 minutes at 66° C. The specimen was then rinsed with water and etched for 3 minutes in an aqueous solution of sodium persulfate [G-4 MicroEtch: MacDermid Incorporated: 16 oz. per gallon] at 21° C. in order to increase the specific surface area. The specimen was rinsed with water, then with 10% sulfuric acid to remove any residues and finally rinsed with water and dried.

Demonstration of Increased Adhesion Produced in Accordance with the Process of the Invention A number of pieces of copper foil (4"×4"), after pretreatment as described above, were coated with copper oxide by immersion for 4 minutes in an aqueous solution containing 130 g. per liter of sodium chlorite, 25 g. per liter of sodium hydroxide and 5 g. per liter of trisodium phosphate at 71° C. Half of the specimens were thereafter immersed for 45 seconds in a solution containing 2 g. per liter of chromium trioxide at 71° C. All the specimens were finally rinsed with water and dried. One of the specimens which had been subjected to the chromic acid treatment was immersed in 10% sulfuric acid and it was observed that a time of 6.5 minutes of immersion was required to remove the copper oxide coating and leave clean copper exposed. In contrast, a specimen which had not been subjected to the chromic acid treatment required less than 35 seconds to remove the copper oxide layer.

Multilayer boards were prepared under identical pressing conditions (350 psi at 177° C. for 1 hour) from a stack of the chromic acid treated specimens interleaved with epoxy prepregs and from a stack of the specimens not treated with chromic acid interleaved with epoxy prepregs. The adhesion values for the layers in the laminate were determined before and after solder immersion (10 seconds at 288° C.) using a pull tester to measure the tension required to pull 1 inch strips of foil from the epoxy layer at a 90° angle at a rate of 1 inch per minute. The results of this test were as follows.

| Treatment of Copper | Before Solder | After Solder Immersion |
| --- | --- | --- |
| copper oxide alone | 5.8 lbs/in. | 4.8 lbs/in. |
| copper oxide + chromic acid | 7.1 lbs/in. | 5.8 lbs/in. |

It will be seen from the above data that the adhesion values for the copper foil treated in accordance with the invention were significantly higher than for that which had not been so treated.

EXAMPLE 2

A number of pieces of copper foil (4"×4"), after pretreatment as described in Example 1, were coated with a tin layer by immersion for 2 minutes in an immersion tin solution [XD 2552; MacDermid Incorporated] at ambient temperature (circa 20° C.). Half of the tin coated foils so prepared were additionally treated by immersion for 2 minutes in a solution of 2 g. of chromium trioxide per liter of water at 71° C. All the specimens were finally rinsed with water and dried.

Using the conditions and process described in Example 1, multilayer boards were prepared by lamination between interleaved epoxy prepregs using the chromic acid treated sheets in one board and the sheets not treated with chrmic acid in the other. Adhesion values were determined, using the pull tester procedure described in Example 1, both before and after solder immersion. The results were as follows.

| Treatment of Copper | Before Solder | After Solder Immersion |
| --- | --- | --- |
| Tin coating alone | 2.0 lbs/in. | 0.5 lbs/in. |
| Tin coating + chromic acid | 5.2 lbs/in. | 3.9 lbs/in. |

It will be seen from the above data that the adhesion values for the copper foil treated in accordance with the invention were markedly higher than for that not so treated.

EXAMPLE 3

The procedure described in Example 1 was repeated exactly as described except that the solution of chromium trioxide was replaced by an aqueous solution of 1.5 g. of chromium trioxide and 2 g. of sodium dichromate per liter. It was found that the time required to remove the copper oxide coating from the foil treated with chromic acid was 3 minutes 45 seconds whereas less than 35 seconds was required in the case of the foil which had not been treated with chromic acid. The adhesion values of the multilayer boards prepared from the chromic acid treated copper oxide coated foils and from the foil not treated with chromic acid were as follows.

| Treatment of Copper | Before Solder | After Solder Immersion |
| --- | --- | --- |
| Copper oxide alone | 5.8 lbs/in. | 4.8 lbs/in. |
| Copper oxide + chromic acid | 6.8 lbs/in. | 5.5 lbs/in. |

Twelve (12) copper clad epoxy boards (12"×18") having a thickness of 0.04 inches were subjected to the pretreatment process set forth in Example 1. Each of the boards was then immersed for 4 minutes in an aqueous solution containing 130 g. per liter of sodium chlorite, 25 g. per liter of sodium hydroxide and 5 g. per liter of trisodium phosphate at 71° C. Thereafter half of the pieces were immersed for 45 seconds in an aqueous solution of 2 g. per liter of chromium trioxide. All the pieces were finally rinsed and dried. Each of the pieces so obtained was laminated between three layers of epoxy prepreg on either side of the board with a sheet of untreated copper foil forming the outer layer of the laminate. The laminating conditions were those described in Example 1. Each of the multilayer boards so obtained was drilled with an identical pattern of through-holes each of 0.04 inches in diameter. The drilled boards were then processed through a typical commerical desmear and plating cycle using the following steps.

In each of the following steps the drilled board was immersed in the particular solution or solvent employed and, except between steps (g) and (h), the boards were rinsed with water after step.

(a) organic hole conditioning solvent [9204: MacDermid: full strength] at 38° C. for 5 minutes.
(b) alkaline permanganate desmear solution [9275: MacDermid: 60 g./liter] at 74° C. for 15 minutes.
(c) 5% aqueous sulfuric acid at 43° C. for 5 minutes.
(d) acidic fluoride glass etch solution [9278: MacDermid: 55 g./liter] at 43° C. for 4 minutes.
(e) 10% aqueous sulfuric acid at 20° C. for 2 minutes.
(f) alkaline hole conditioner/cleaner [9268: MacDermid: 60 g./liter] at 66° C. for 5 minutes.

(g) acid persulfate microetchant [G-4: MacDermid: 120 g./liter] at 35° C. for 2 minutes.

(h) 10% aqueous sulfuric acid at 20° C. for 1 minute.

(i) acidic chloride activator pre-dip [9008: MacDermid] at 29° C. for 1 minute.

(j) acidic palladium activator [Mactivate 10: MacDermid] at 29° C. for 5 minutes.

(k) acidic accelerator [9074: MacDermid] at 29° C. for 2 minutes.

(l) alkaline electroless copper bath [Macudep 52: MacDermid] at 43° C. for 30 minutes.

Finally each board was electroplated with copper using an acidic electrolytic copper bath [MacuSpec: MacDermid] for 54 minutes at 29° C. using 20 ASF.

At the end of the processing each of the boards was examined for presence of a pink ring on the innermost board by grinding away the outer layer of copper and dielectric. It was found that those inner boards which had been subjected to chromic acid treatment in accordance with the invention showed significantly smaller pink rings (average width of ring 8.3 mils) as opposed to those which had not received the chromic acid treatment (average width of ring 23.4 mils).

EXAMPLE 5

Twelve pieces of copper clad epoxy board (12"×18") having a thickness of 0.04 inches were scrubbed mechanically and then subjected to the pretreatment described in Example 1. Each of the boards was then immersed for 2 minutes in a commercial immersion tin bath [XD-2552-T: MacDermid: full strength] at 20° C. Six of the boards so treated were then immersed for 2 minutes in an aqueous solution containing 2 g. per liter of chromium trioxide. All of the boards were rinsed and dried before being incorporated individually in a multilayer board in which the treated board was sandwiched between two layers each of 3 sheets of epoxy prepreg with copper foil sheets on the outer surfaces. The laminating conditions were those set forth in Example 1. Each of the multilayer boards so prepared was drilled with an identical pattern of holes of diameter 0.04 inches. Pieces of the various boards were then subjected to immersion in molten solder for 10 seconds at 288° C. None of the boards having an inner board treated with the chromic acid suffered delamination under these conditions whereas two out of three of the other boards not so treated suffered severe delamination.

What is claimed is:

1. In a process for the preparation of a multilayer printed circuit board which comprises the steps of:
   providing a non-conductive substrate clad on each side with a copper circuit pattern layer;
   applying a coating of adhesion promoter to the copper circuit pattern layers; and
   incorporating the resulting board and one or more additional boards prepared in the same manner into a multilayer board by interposing layers of semicured polymeric non-conductive material between said boards and laminating the assembly using heat and pressure;
the improvement which comprises exposing the copper circuit patterns coated with adhesion promoter to the action of an aqueous chromic acid solution prior to incorporation of said boards into the multilayer board.

2. A process according to claim 1 wherein the adhesion promoter is a layer of copper oxide.

3. A processing according to claim 2 wherein said copper oxide is applied by contacting the copper circuit pattern with an aqueous solution containing an alkali metal chlorite or alkaline earth metal chlorite at a concentration of from 50 grams per liter to complete saturation and sodium or potassium hydroxide at a concentration of from 5 to 25 grams per liter.

4. A process according to claim 1 wherein the adhesion promoter is a layer of tin.

5. A process according to claim 1 wherein the chromic acid solution is obtained by acidifying an aqueous solution of an alkali metal bichromate to a pH in the range of about 1.5 to about 2.5.

6. A process according to claim 1 wherein the chromic acid solution is at a temperature in the range of about 20° C. to about 90° C.

7. A process according to claim 1 wherein the substrate with copper circuit patterns coated with adhesion promoter is immersed in the aqueous chromic acid solution for a period of about 10 seconds to about 5 minutes.

8. A process according to claim 1 wherein the chromic acid solution is applied to the copper circuit patterns coated with adhesion promoter by spraying said solution on said patterns.

9. A process according to claim 1 wherein the solution of chromic acid contains from about 0.1 to about 50 grams per liter of the said acid.

10. In a process for the preparation of a multilayer printed circuit board the steps comprising:
    providing a plurality of non-conductive substrates clad on each side with a layer of copper;
    applying a relief resist image of a circuit pattern to each copper layer and etching away the exposed copper;
    removing the resist and applying a coating of copper oxide to the exposed copper circuit pattern;
    exposing the copper oxide-coated copper circuit pattern to the action of an aqueous chromic acid solution; and
    thereafter incorporating said plurality of boards so prepared into multilayer board by interposing layers of semi-cured polymeric nonconductive material between said boards and laminating the assembly using heat and pressure.

11. A process according to claim 10 wherein the layer of copper oxide is applied by contacting the copper circuit pattern with an aqueous solution containing an alkali metal chlorite or alkaline earth metal chlorite at a concentration of from 50 grams per liter to complete saturation and sodium or potassium hydroxide at a concentration of from 5 to 25 grams per liter.

12. A process according to claim 10 wherein the copper oxide-coated copper circuit pattern is immersed in the chromic acid solution at about 20° C. to about 90° C. for a period of about 10 seconds to about 5 minutes.

13. A process according to claim 10 wherein the chromic acid solution is obtained by acidifying an aqueous solution of an alkali metal bichromate to a pH in the range of about 1.5 to about 2.5.

14. A process according to claim 10 wherein the amount of chromic acid present in the solution thereof is from about 0.1 to about 50 grams per liter.

* * * * *